(12) United States Patent
DeVoe et al.

(10) Patent No.: US 6,855,478 B2
(45) Date of Patent: Feb. 15, 2005

(54) MICROFABRICATION OF ORGANIC OPTICAL ELEMENTS

(75) Inventors: Robert J. DeVoe, Oakdale, MN (US); Catherine A. Leatherdale, St. Paul, MN (US); Guoping Mao, Woodbury, MN (US); Patrick R. Fleming, Lake Elmo, MN (US); Harvey W. Kalweit, Burnsville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 215 days.

(21) Appl. No.: 10/297,957

(22) PCT Filed: Jun. 14, 2001

(86) PCT No.: PCT/US01/19038

§ 371 (c)(1),
(2), (4) Date: Dec. 12, 2002

(87) PCT Pub. No.: WO01/96915

PCT Pub. Date: Dec. 20, 2001

(65) Prior Publication Data

US 2004/0126694 A1 Jul. 1, 2004

Related U.S. Application Data

(60) Provisional application No. 60/211,701, filed on Jun. 15, 2000.

(51) Int. Cl.[7] ............................. G03C 1/73; G02B 6/00
(52) U.S. Cl. ................................... 430/270.1; 430/321
(58) Field of Search ............................... 430/321, 270.1

(56) References Cited

U.S. PATENT DOCUMENTS

| 3,018,262 A | 1/1962 | Schroeder |
| 3,117,099 A | 1/1964 | Proops et al. |
| 3,729,313 A | 4/1973 | Smith |

(List continued on next page.)

FOREIGN PATENT DOCUMENTS

| DE | 41 42 327 | 6/1993 |
| DE | 42 19 376 | 12/1993 |
| WO | WO 92/00185 | 1/1992 |
| WO | WO 98/21521 | 5/1998 |
| WO | WO 99/23650 | 5/1999 |
| WO | WO 99/53242 | 10/1999 |
| WO | WO 99/54784 | 10/1999 |
| WO | WO 02/079691 | 10/2002 |

OTHER PUBLICATIONS

R. D. Allen, G. M. Wallraff, W. D. Hinsberg, and L. L. Simpson in *High Performance Acrylic Polymers for Chemically Amplified Photoresist Applications*, J. Vac. Sci. Technol. B, 9, 3357 (1991).

C. Xu and W. W. Webb in *J. Opt. Soc. Am. B*, 13, 481 (1996).

R. D Allen et al. in *Proc. SPIE* 2438, 474 (1995).

I. B. Berlman in *Handbook of Fluorescence Spectra of Aromatic Molecules*, Second Edition, pp. 24–27, Academic Press, New York (1971).

(List continued on next page.)

*Primary Examiner*—John A. McPherson
(74) *Attorney, Agent, or Firm*—David B. Kagan; Lucy C. Weiss

(57) ABSTRACT

Method of fabricating an optical element. A photodefinable composition is provided that includes (i) a hydrophobic, photodefinable polymer, said photodefinable polymer having a glass transition temperature in the cured state of at least about 80° C.; and (ii) a multiphoton photoinitiator system comprising at least one multiphoton photosensitizer and preferably at least one phtoinitiator that is capable of being photosensitized by the photosensitizer. One or more portions of the composition are imagewise exposed to the electromagnetic energy under conditions effective to photodefinably form at least a portion of a three-dimensional optical element.

19 Claims, 1 Drawing Sheet

U.S. PATENT DOCUMENTS

| | | |
|---|---|---|
| 3,741,769 A | 6/1973 | Smith |
| 3,758,186 A | 9/1973 | Brumm |
| 3,779,778 A | 12/1973 | Smith et al. |
| 3,808,006 A | 4/1974 | Smith |
| 3,954,475 A | 5/1976 | Bonham et al. |
| 3,987,037 A | 10/1976 | Bonham et al. |
| 4,041,476 A | 8/1977 | Swainson |
| 4,078,229 A | 3/1978 | Swanson et al. |
| 4,228,861 A | 10/1980 | Hart |
| 4,238,840 A | 12/1980 | Swainson |
| 4,250,053 A | 2/1981 | Smith |
| 4,279,717 A | 7/1981 | Eckberg et al. |
| 4,288,861 A | 9/1981 | Swainson et al. |
| 4,333,165 A | 6/1982 | Swainson et al. |
| 4,394,403 A | 7/1983 | Smith |
| 4,394,433 A | 7/1983 | Gatzke |
| 4,466,080 A | 8/1984 | Swainson et al. |
| 4,471,470 A | 9/1984 | Swainson et al. |
| 4,491,628 A | 1/1985 | Ito et al. |
| 4,547,037 A | 10/1985 | Case |
| 4,588,664 A | 5/1986 | Fielding et al. |
| 4,642,126 A | 2/1987 | Zador et al. |
| 4,652,274 A | 3/1987 | Boettcher et al. |
| 4,666,236 A | 5/1987 | Mikami et al. |
| 4,775,754 A | 10/1988 | Vogel et al. |
| 4,859,572 A | 8/1989 | Farid et al. |
| 4,963,471 A | 10/1990 | Trout et al. |
| 5,006,746 A | 4/1991 | Kasuga et al. |
| 5,034,613 A | 7/1991 | Denk et al. |
| 5,037,917 A | 8/1991 | Babb et al. |
| 5,145,942 A | 9/1992 | Hergenrother et al. |
| 5,159,037 A | 10/1992 | Clement et al. |
| 5,159,038 A | 10/1992 | Babb et al. |
| 5,225,918 A | 7/1993 | Taniguchi et al. |
| 5,235,015 A | 8/1993 | Ali et al. |
| 5,289,407 A * | 2/1994 | Strickler et al. ............ 365/106 |
| 5,422,753 A | 6/1995 | Harris |
| 5,446,172 A | 8/1995 | Crivello et al. |
| 5,478,869 A | 12/1995 | Takahashi et al. |
| 5,545,676 A | 8/1996 | Palazzotto et al. |
| 5,665,522 A | 9/1997 | Vogel et al. |
| 5,747,550 A | 5/1998 | Nohr et al. |
| 5,750,641 A | 5/1998 | Ezzell et al. |
| 5,753,346 A | 5/1998 | Leir et al. |
| 5,759,721 A | 6/1998 | Dhal et al. |
| 5,770,737 A | 6/1998 | Reinhardt et al. |
| 5,847,812 A | 12/1998 | Ooki et al. |
| 5,854,868 A | 12/1998 | Yoshimura et al. |
| 5,856,373 A | 1/1999 | Kaisaki et al. |
| 5,859,251 A | 1/1999 | Reinhardt et al. |
| 5,864,412 A | 1/1999 | Wilde |
| 5,998,495 A | 12/1999 | Oxman et al. |
| 6,005,137 A | 12/1999 | Moore et al. |
| 6,025,406 A | 2/2000 | Oxman et al. |
| 6,025,938 A | 2/2000 | Kathman et al. |
| 6,048,911 A | 4/2000 | Shustack et al. |
| 6,100,405 A | 8/2000 | Reinhardt et al. |
| 6,103,454 A | 8/2000 | Dhar et al. |
| 6,215,095 B1 | 4/2001 | Partanen et al. |
| 6,267,913 B1 | 7/2001 | Marder et al. |
| 6,322,931 B1 | 11/2001 | Cumpston et al. |
| 6,541,591 B2 | 4/2003 | Olson et al. |

OTHER PUBLICATIONS

J. N. Demas and G. A. Crosby in *J. Phys. Chem.* 75, 991–1024 (1971).

J. V. Morris, M. A. Mahoney, and J. R. Huber in *J. Phys. Chem.* 80, 969–974 (1976).

*Bull. Chem. Soc,* Japan, 42, 2924–2930 (1969).

R. J. Cox, *Photographic Sensitivity,* Academic Press (1973), R.J. Cox. ed., pp. 241–263.

D. F. Eaton in *Advanced in Photochemistry,* B. Voman et al., vol. 13, pp. 427–488, (1986).

Beringer et al., *J. Am. Chem. Soc, 81,* 342 (1959).

Makukha et al., Two–Photon–Excitation Spatial Distribution for Cross Focused Gaussian Beams, *Applied Optics,* vol. 40, No. 23, pp. 3932–3936 (Aug. 10, 2001).

Bunning et al. *Electronically Switchable Grating Formed Using Ultrafast Holographic Two–Photon–Induced Photopolymerization, Chem. Mater.,* 2000, 12 pp. 2842–2844.

Diamond et al., *Two–Photon Holography in 3–D Photopolymer Host–Guest Matrix, Optics Express,* vol. 6, No. 3, Jan. 31, 2000, pp. 64–68.

Diamond et al., *Two–Photon Holography in 3–D Photopolymer Host–Guest Matrix: errata, Optic Express,* vol. 6, No. 4, Feb. 14, 2000, pp. 109–110.

Ashley et al., *Holographic Data Storage, IBM J. Res. Develop.* vol. 44, No. 3, May 2000, pp. 341–368.

Belfield et al., *Near–IR Two–Photon Photoinitiated Polymerization Using a Fluorone/Amine Initiating System, J. Am. Chem. Soc.,* 2000, 122 pp. 1217–1218.

Campagnola et al., *3–Dimensional Submicron Polymcrization of Acrylamide By Multiphoton Excitation of Xanthene Dyes, Macromolecules,* 2000, vol. 33, pp. 1511–1513.

Hong–Bo Sun et al., *Three–dimensional Photonic Crystal Structures Achieved With Two–Photon–Absorption Photopolymerization of Material, Applied Physics Letters,* vol. 74, No. 6, Feb. 8, 1999, pp. 786–788.

Cumpston et. el. *Two–Photon Polymerization Initiators For Three–Dimensional Optical Data Storage and Microfabrication, Nature,* vol. 398, Mar. 4, 1999, pp. 51–54.

Joshi et al., *Three–dimensional Optical Circuitry Using Two–Photo–Assisted Polymerization, Applied Physics Letters,* vol. 74, No. 2, Jan. 11, 1999, pp. 170–172.

Bunning et al., *Electrically Switchable Grating Formed Using Ultrafast Holographic Two–Photon–Induced Photopolymerization, Chem. Mater.* 2000, vol. 12, pp. 2842–2844.

Kirkpatrick et al. *Holographic Recording Using Two–Photon–Induced Photopolymerization, Appl Phys. A,* vol. 69, pp. 461–464, 1999.

Maruo s et al., *Movable Microstructures made by Two–Photon Three–Dimensional Microfabrication,* 1999 International Symposium on Micromechatronics and Human Science, vol. 23, pp. 173–178 XP002191032.

Kueberl S M et al., *Three–Dimensional Microfabrication Using Two–Photon Activated Chemistry, SPIE* vol. 3937, pp. 97–105, Jan. 27, 2000 XP0080000209.

Cumpston B H et al., *New Photopolmers Based on Two–Photon Absorbing Chromophores and Application to Three–Dimensional Microfabrication and Optical Storage, Mat. Res. Soc. Symp. Proc.,* vol. 488, pp. 217–225, 1998, XP0080000191.

Kawata S. et al., *Photon–Iduces Micro/Nano Fabrication, Manipulation and Imaging with Unconvential Photo–Active Systems, Mol. Cryst. Liq. Cryst.,* vol. 314, pp. 173–178, Aug. 25, 1997, XP001059839.

Tanaka et al., *Three–Dimensional Fabrication and Observation of Micro–Structures Using Two–Photon Absorption and Fluorescence, SPIE,* vol. 3937, pp. 92–96, Jan. 27, 2000, XP001051866.

Wensellers et al., *Five Orders–of Magnitude Enhancement of Two–Photon Absorption for Dyes On Silver Nanoparticle Fractal Clusters, J. Phys. Chem. B,* vol. 106, pp. 6853–6863, 2002.

Zhou et al., *Efficient Photacids Based Upon Triarylamine Dialkylsulfonium Salts, J. Am. Chem. Soc.,* vol,. 124, No. 9, pp. 1897–1901.

Zhou et al., *An Efficient Two–Photon–Generated Photoacid Applied To Positive–Tone 3D Microfabrication, Science,* vol. 296, pp. 1106–1109, May 10, 2002.

Stellacci et al., *Laser and Electon–Beam Induced Growth of Nanoparticles for 2D and 3D Metal Patterning, Adv. Mater.,* vol. 14, No. 3, pp. 194–198, Feb. 2002.

Watanabe et al., *Photoreponsive Hydrogel Microstructure Fabricated by Two–Photon Initiated Polymerization, Adv. Func. Mater.,* vol. 12, No. 9, pp. 611–614, Sep. 2002.

Hong–Bo Sun, *Real Three–Dimensional Microstructures Fabricated By Photopolymerization of Resins Through Two–Photon Absorption, Optical Letters,* vol. 25, No. 5, pp. 1110–1112, Aug. 2000.

Misawa et al., *Microfabrication By Femtosecond Laser Irradiation, SPIE.,* vol. 3933, pp. 246–260, 2000.

Miwa, *Femtosecond Two–Photon Stereo–Lithography, Applied Physics A,* vol. 73, No. 5, pp. 561–566, 2001.

Kawata et al., *Two–Photon Photopolymerization of Functional Micro–Devices, Journal of Photopolymer Science and Technology,* vol. 15, No. 3, pp. 471–474, 2002.

Boiko et al., *Threshold Enhancement in Two–Photon Photopolymerization, SPIE,* vol. 4097, pp. 254–263, 2000.

Belfield et al., *Multiphoton–Absorbing Organic Materials For Microfabrication,* Emerging Optical Applications and Non–Destructive Three–Dimensional Imaging, *J. Phys. Org.,* vol. 13, pp. 837–849, 2000.

Serbin et al., *Femtosecond Laser–Induced Two–Photon Polymerization of Inorganic–Organic Hybrid Materials for Applications in Photonics, Optics Letters,* vol. 28, No. 5, pp. 301–303, Mar. 2003.

Davidson, *The Chemistry of Photoinitiators Some Recent Developments, J. Photochem. Photobiol. A.,* vol. 73, pp. 81–96, 1993.

Dektar et al., *Photochemistry of Triarylsulfonium Salts, J. Am. Chem. Soc.,* vol. 112, pp. 6004–6015, 1990.

Denk et al., *Two–Photon Laser Scanning Fluorescence Microscopy, Science,* vol. 248, pp. 73–76, Apr. 1990.

Dvornikov et al., *Two–Photon Three–Dimensional Optical Storage Memory, Advances in Chemistry Series,* vol. 240, pp. 161–177, 1994.

Goppert–Mayer, *Uber Elmentarakte Mit zwei Quantesprungen, Ann. Phys.,* vol. 9, pp. 273–294, 1931.

Ito, *Chemical Amplification Resists: History and Development Within IBM, IBM J. Res. Develop.,* vol. 41, No. ½ , pp. 69–80, Mar. 1997.

Jenkins et al., *Fundamentals of Optics,* 3rd Edition, McGraw–Hill, New York, pp. 331, 1957.

Kavarnos et al., *Photosensitization By Reversible Electron Transfer: Theories, Experimental Evidence, and Examples, Chem. Rev.,* vol. 86, pp. 401–449, Apr. 1986.

Kennedy et al., *p–Bis(o–methylstyryl) benzene as a Power–Squared Sensor for Two–Photon Absorption Measurements between 537 and 694 nm, Anal. Chem.,* vol. 58, pp. 2643–2647, 1986.

Kewitsch et al., *Self–Focusing and Self–Trapping of Optical Beams Upon Photopolymerization, Optics Letters,* vol. 21, No. 1, pp. 24–26, Jan. 1996.

Lee et al., *Micromachining Applications of a High Resulution Ultrathick Photoresist, J. Vac. Sci. Technol. B,* vol. 13, pp. 3012–3016, Dec. 1995.

Lipson et al., *Nature of the Potential Energy Surfaces for the Snl Reaction A Picosecond Kinetic Study of Homolysis and Heterolysis for Diphenylmethyl Chlorides, J. Am. Chem. Soc.,* vol. 118, pp. 2992–2997, 1996.

Lorenz et al., *SU–8: a low cost negative resist for MEMS, J. Micromech. Microeng.,* vol. 7, pp. 121–124, 1997.

Maiti et al., *Measuring Serotonin Distribution in Live Cells with Three–Photon Excitation, Science,* vol. 275, pp. 530–532, Jan. 1997.

March, *Advanced Organic Chemistry: Reactions, Mechanisms and Structure,* Four Edition, 1992, Wiley–Interscience, New York, p. 205.

March, *Advanced Organic Chemistry: Reactions, Mechanisms and Structure,* Four Edition, 1992, Wiley–Interscience, New York, Chapter 2.

March, *Advanced Organic Chemistry: Reactions, Mechanisms and Structure,* Four Edition, 1992, Wiley–Interscience, New York, Chapter 9.

Maruo et al., *Two–Photon–Absorbed Photopolymerization for Three–Dimensional Microfabrication, IEEE,* The Tenth Annual International Workshop on Micro Electro Mechanical Systems, pp. 169–174, 1997.

Maruo et al., *Three–Dimensional Microfabrication With Two–Photon–Absorbed Photopolymerization, Optic Letters,* vol. 22, No. 2, pp. 132–134, Jan. 1997.

McClelland et al., *Laser Flash Photolysis of 9–Fluorenol. Production and Reactivities of the 9–Fluorenal Radical Cation and the 9–Fluorenyl Cation, J. Am. Chem. Soc.,* vol. 112, pp. 4857–4861, 1990.

McClelland et al., *Flash Photolysis Study of a Friedel–Crafts alkylation. Reaction of the Photogenerated 9–Fluorenyl cation with aromatic compounds, J. Chem. Soc.,* vol. 2, pp. 1531–1543, 1996.

Odian, *Principles of Polymerization* Second Edition John Wiley & Sons, New York, 1981, pp. 181.

Richardson, *Langmuir–Blodgett Films,* An Introduction to Molecular Electronics, Chapter 10, 1995.

Pitts et al., *Submicro Multiphoton Free–Form Fabrication of Proteins and Polymers: Studies of Reaction Efficiencies and Applications in Sustained Release, Macromolecules,* vol. 33, pp. 1514–1523, 2000.

He et al., *Two–Photon Absorption and Optical–Limiting Properties of Novel Organic Compounds, Optics Letters,* vol. 20, No. 5, pp. 435–437, Mar. 1995.

Parthenopoulos et al., *Three–Dimensional Optical Storage Memory, Science,* vol. 245, pp. 843–845, Aug. 1989.

Shaw et al., *Negative Photoresists for Optical Lithography, IBM J. Res. Develop.,* vol. 41, No. ½ , pp. 81–94, Jan./Mar. 1997.

Shirai et al., *Photoacid and Photobase Generators: Chemistry and Applications to Polymeric Materials, Prog. Polym. Sci.,* vol. 21, pp. 1–45, 1996.

Smith, *Modern Optic Engineering,* 1966, McGraw–Hill, pp. 104–105.

Strickler et al., *Three–Dimensional Optical Data Storage in Refractive Media by Two–Photon Point Excitation, Optics Letters,* vol. 16, No. 22, pp. 1780–1782, Nov. 1991.

Strickler et al., *3–D Optical Data Storage By Two–Photon Excitation, Adv. Mater.,* vol. 5, No. 6, pp. 479–1993.

Thayumanavan et al, *Synthesis of Unsymmetrical Triarylamines for Photonic Applications via One–Pot Palladium–Catalyzed Aminations, Chem. Mater.,* vol. 9, pp. 3231–3235, 1997.

Wan et al., *Contrasting Photosolvolytic Reactivities of 9–Fluorenol vs. 5–Suberenol Derivatives. Enhanced Rate of Formation of Cyclically Conjugated Four π Carbocations in the Excited State, J. Am. Chem. Soc.,* vol. 111, pp. 4887–4895, 1989.

Williams et al., *Two–Photon Molecular Excitation Provides Intrinsic 3–Dimensional Resolution for Laser–based Microscopy and Microphotochemistry, FASEB Journal,* vol. 8, pp. 804–813, Aug. 1994.

Xu et al., *Multiphoton Fluorescence Excitation: New Spectral Windows for Biological Nonlinear Microscopy, Proc. Natl. Acad. Sci. USA,* vol. 93, pp. 10763–10768, Oct. 1996.

Yuste et al., *Dendritic Spines as Basic Functional Units of Neuronal Integration, Nature,* vol. 375, pp. 682–684, Jun. 1995.

Kosar, *Photochemical Formation and Destruction of Dyes, Light–Sensitive Systems,* John Wiley & Sons, New York, NY, 1965, Chapter 8.

Badlwinson, *Auxiliaries Associated With Main Dye Classes, Clorants and Auxiliaries,* vol. 2, 1990, Chapter 12.

Syper et al., *Synthesis of Oxiranylquinones as New Potential Bioreductive Alkylating Agents, Tetrahedron,* vol. 39, No. 5, pp. 781–792, 1983.

Zollinger, *Color Chemistry,* VCH, Weinheim, GE, 1991, Chapter 8.

Misawa et al., *Multibeam Laser Manipulation and Fixation of Microparticles, Appl. Phys. Letter,* vol. 60, No. 3, pp. 310–312, Jan. 20, 1992. (XP 002189602).

Sun et al., *Photonic Crystal Structures With Submicrometer–Spatial Resolution Achieved By High Power Femtosecond Laser–Induced Photopolymerization, SPIE,* vol. 3888, pp. 122–130, 2000. (XP 001051864).

* cited by examiner

MICROFABRICATION OF ORGANIC OPTICAL ELEMENTS

STATEMENT OF PRIORITY

This application is a National Stage (371) of PCT/US01/19038, filed Jun. 14, 2001, which claims the priority of U.S. Provisional Application No. 60/211,701 filed Jun. 15, 2000, the contents of which are hereby incorporated by reference.

FIELD OF THE INVENTION

This invention relates to the use of multiphoton-induced photodefining methods for fabricating optically functional elements (e.g., waveguides, diffraction gratings, other optical circuitry, lenses, splitters, couplers, ring resonators, and the like) that find particular utility in optical communication systems.

BACKGROUND OF THE INVENTION

Optical interconnects and integrated circuits may be used, in one application, optically connect one or more optical fibers to one or more remote sites, typically other optical fibers. For example, where light is carried by one or more input fiber(s), the light may be transferred to, split between, or merged into one or more remote sites. Active or passive devices within the optical integrated circuit may also modulate or switch the input signal. Optical interconnects play an important role in fiber telecommunication, cable television links, and data communication. A waveguide is a type of optical interconnect.

For the most part, commercially available optical interconnects have been made of glass. Such interconnects, or couplers, are generally made by fusing glass optical fibers or by attaching glass fibers to a planar, glass integrated optical device that guides light from input fiber(s) to output fiber(s) attached to different ends of the device. Both approaches are labor intensive and costly. The cost increases proportionately with the number of fibers used due to the additional labor needed to fuse or attach each individual fiber. Such intensive labor inhibits mass production of these devices.

A further problem results from the mismatch in shape of the optical modes in the glass fiber and the integrated optical device. Glass fiber cores are typically round, whereas the channel guides tend to have rectilinear cross-sections. This mismatch tends to cause insertion losses when a fiber is butt coupled to an integrated optical device. Thus, there is a strong need for an integrated optical device or interconnect that can be easily attached to optical fibers with good mode matching.

As compared to glass structures, polymeric optical structures offer many potential advantages, and it would be desirable to have polymeric optical elements that could satisfy the demands of the telecommunications industry. Advantages of polymeric elements would include versatility of fabrication techniques (such as casting, solvent coating, and extrusion followed by direct photo-patterning), low fabrication temperatures (down to room temperature, allowing compatibility with a greater variety of other system components and substrates than is possible with the high processing temperatures characteristic of inorganic materials), and the potential ability to fabricate unique devices in three dimensions, all of which could lead to lower cost and high volume production.

Unlike glass optical interconnects, two-dimensional, polymeric channel waveguides are relatively easily produced. Numerous methods for fabricating polymeric waveguides have been developed. For example, electroplating nickel onto a master to form a channel waveguide mold and using photoresist techniques to form waveguide channels have been known for years. Cast-and-cure methods have supplemented older injection molding methods of forming polymeric channel waveguides. Following formation of the channel waveguide, further cladding and protective coatings typically is added inasmuch as polymeric waveguides generally must be protected from the environment to prevent moisture uptake or damage that could adversely affect performance.

The manufacture of other three dimensional, microoptical elements has been quite challenging. Ion diffusion methods involve complex, multistep processes to build three dimensional structures. Photolithographic techniques, e.g., photoresist reflow, have been used to make lenses and the like. However, the range of shapes that can be made using lithography are limited by a number of factors including surface tension effects. Photolithography also is limited to the fabrication of elements whose optical axis is normal to the substrate upon which the element is fabricated. It is difficult, for instance, to make elements with accurate undercuts using photolithography.

U.S. Pat. No. 5,402,514 describes a different approach for manufacturing a polymeric, three dimensional interconnect by laminating dry films together. In these laminate structures, the outer layer(s) function as the cladding and the inner layers incorporate the optical circuitry. Single photon photopolymerization is used to photocure portions of each lamina. In order to build up three-dimensional circuitry using this approach, multiple exposure steps would be required to form each photocured lamina. Alignment of the layers during assembly to form the laminate structure could also prove problematic. The layers would also be subject to delamination if the bond quality between layers is poor.

Multiphoton polymerization techniques offer the potential to fabricate three dimensional optical structures more conveniently. Molecular two-photon absorption was predicted by Goppert-Mayer in 1931. Upon the invention of pulsed ruby lasers in 1960, experimental observation of two-photon absorption became a reality. Subsequently, two-photon excitation has found application in biology and optical data storage, as well as in other fields.

There are two key differences between two-photon induced photoprocesses and single-photon induced processes. Whereas single-photon absorption scales linearly with the intensity of the incident radiation, two-photon absorption scales quadratically. Higher-order absorptions scale with a related higher power of incident intensity. As a result, it is possible to perform multiphoton processes with three-dimensional spatial resolution. Also, because multiphoton processes involve the simultaneous absorption of two or more photons, the absorbing chromophore is excited with a number of photons whose total energy is equal to or greater than the energy of an excited state of the chromophore, even though each photon individually has insufficient energy to excite the chromophore. Because the exciting light is not attenuated by single-photon absorption within a curable matrix or material, it is possible to selectively excite molecules at a greater depth within a material than would be possible via single-photon excitation by use of a beam that is focused to that depth in the material. These two phenomena also apply, for example, to excitation within tissue or other biological materials.

Major benefits have been foreshadowed by applying multiphoton absorption to the areas of photocuring and microfabrication. For example, in multiphoton lithography or stereolithography, the nonlinear scaling of multiphoton absorption with intensity has provided the ability to write features having a size that is less than the diffraction limit of the light utilized, as well as the ability to write features in three dimensions (which is also of interest for holography).

The use of multiphoton-induced photopolymerization has been described in Mukesh P. Joshi et al., "Three-dimensional optical circuitry using two-photo-assisted polymerization," Applied Physics Letters, Volume 74, Number 2, Jan. 11, 1999, pp. 170–172; Cornelius Diamond et al., "Two-photon holography in 3-D photopolymer host-guest matrix," OPTICS EXPRESS, Vol. 6, No. 3, Jan. 31, 2000, pp. 64–68; Cornelius Diamond, "OMOS: Optically Written Micro-Optical Systems in Photopolymer," Ph.D. Thesis, January 2000; Brian H. Cumpston et al., "Two-photon polymerization initiators for three-dimensional optical data storage and microfabrication," NATURE, Vol. 398, Mar. 4, 1999, pp. 51–54; T. J. Bunning et al., "Electrically Switchable Gratings Formed Using Ultrafast Holographic Two-Photon-Induced Photopolymerization," Chem. Mater. 2000, 12, 2842–2844; Cornelius Diamond et al., "Two-photon holography in 3-D photopolymer host-guest matrix: errata," OPTICS EXPRESS, Vol. 6, No. 4, Feb. 14, 2000, pp. 109–110; S. M. Kirkpatrick et al., "Holographic recording using two-photon-induced photopolymerization," Appl. Phys. A 69, 461–464 (1999); Hong-Bo Sun et al., "Three-dimensional photonic crystal structures achieved with two-photon-absorption photopolymerization of resin," APPLIED PHYSICS LETTERS, Volume 74, Number 6, Feb. 8, 1999, pp. 786–788; Kevin D. Belfield et al., "Near-IR Two-Photon Photoinitiated Polymerization Using a Fluorone/Amine Initiating System," J. Am. Chem. Soc. 2000, 122, 1217–1218.

The stability and quality of three dimensional optical structures made using multiphoton polymerization techniques remains a concern. Elements made to date have not been made in fully cured materials, thus, having poor stability, especially when exposed to light. Others are free standing and are not encapsulated, thus being sensitive to the surrounding environment and having potential stability issues relative to optical performance. It is also more challenging to achieve high circuit density when the boundaries between adjacent elements cannot be controlled with sufficient precision. Other methods have provided elements whose shape, index of refraction properties, and/or other or chemical physical properties are not stable, to further exposure to light, for example, and tend to degrade in a relatively short time.

Polymer materials may also be susceptible to water, vapor, or other moisture uptake. Such uptake can cause a polymeric optical element to change shape. This can also cause index of refraction and other properties to change over time.

Thus, while polymeric optical elements have been of interest in the telecommunications industry, certain physical and optical deficiencies have limited wide acceptance of such devices. There remains a strong need in the art for three dimensional, stable, polymeric optical elements that can be manufactured with a high degree of precision, as desired.

SUMMARY OF THE INVENTION

The present invention provides three-dimensional, polymeric, optical circuits and elements with excellent dimensional and optical stability over wide temperature ranges. The optical characteristics, e.g., index of refraction, are also stable, thus maintaining consistent optical performance over time in many applications. The present invention provides fabrication methods that allow optical elements to be fabricated with a wide range of desired shapes, orientations, and geometries.

In one aspect, the present invention provides a method of fabricating an optical element. A photo-hardenable composition is provided that includes (i) a hydrophobic, photodefinable polymer, said photodefinable polymer having a glass transition temperature in the cured state of at least about 80° C.; and (ii) a multiphoton photoinitiator system comprising at least one multiphoton photosensitizer and preferably at least one photoinitiator that is capable of being photosensitized by the photosensitizer. One or more portions of the composition are imagewise exposed to the electromagnetic energy under conditions effective to photodefinably form at least a portion of a three-dimensional optical element.

In another aspect, the present invention relates to a method of fabricating an optical element. A photo-hardenable composition is provided that includes (i) a hydrophobic, photodefinable polymer, said photodefinable polymer having a glass transition temperature in the cured state of at least about 80° C., and preferably having a substantially constant index of refraction in the cured state in a temperature range from 0° C. to 80° C.; and (ii) a multiphoton photoinitiator system comprising at least one multiphoton photosensitizer and preferably at least one photoinitiator that is capable of being photosensitized by the photosensitizer. The photo-hardenable fluid composition is coated onto a substrate. One or more portions of the coated composition are imagewise exposed to said electromagnetic energy under conditions effective to photodefinably form at least a portion of a three-dimensional optical element.

In another aspect, the present invention relates to a photohardenable composition that can be imagewise cured using a multiphoton curing technique. The composition comprises a hydrophobic, photodefinable polymer having a glass transition temperature in the cured state of at least about 80° C., and preferably having a substantially constant index of refraction in the cured state in a temperature range from 0° C. to 80° C. The composition also includes a multiphoton photoinitiator system comprising at least one multiphoton photosensitizer and preferably at least one photoinitiator that is capable of being photosensitized by the photosensitizer.

In preferred embodiments, multiphoton curing is optionally followed by solvent development in which a solvent is used to remove uncured material and thereby recover the resultant optical element. Those embodiments that incorporate a polyimide or polyimide precursor may be subjected to an imidization step, if desired, after multiphoton curing. As used hereinafter, the term "polyimide" with respect to a photocurable material shall encompass polyimides as well as polyimide precursors. Such precursors include, for example, poly(amic acid) materials and the like that form polyimides upon curing, imidization, and/or other treatment.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

Preferred embodiments of the present invention provide methods of preparing polymeric optical elements that have excellent dimensional, chemical, and optical (n(T)) stability over wide temperatures ranges, e.g., 0° C. to 80° C., preferably −25° C. to 100° C., more preferably −25° C. to 120° C. The preferred methods involve multiphoton-initiated photodefining of selected portions of a mass including one or more constituents with photodefinable functionality, whereby optical element(s) with three-dimensional geometries can be formed. The resultant optical element may be separated from some or all of the remaining, uncured material, which may then be reused if desired. Some preferred resins, for example, some photodefinable polyimides, may also be subjected to a post-development bake to cause imidization.

Figure 1:
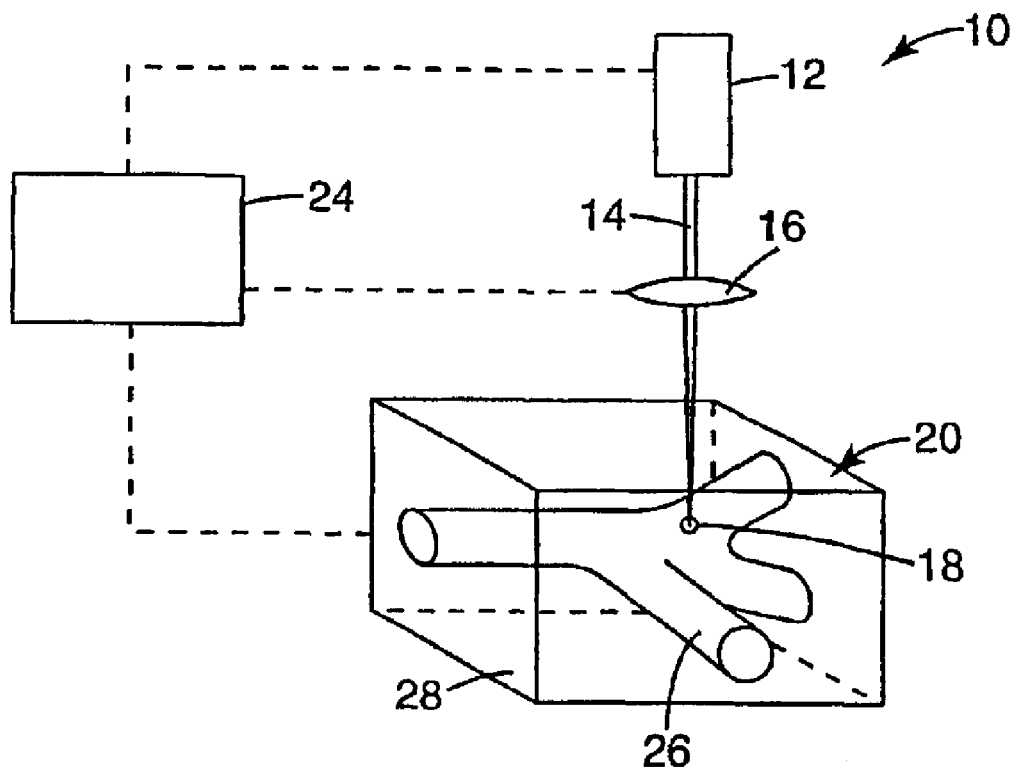
FIG. 1 is a schematic representation of a system showing how imagewise exposure forms an optical element in a body.
Figure 2:
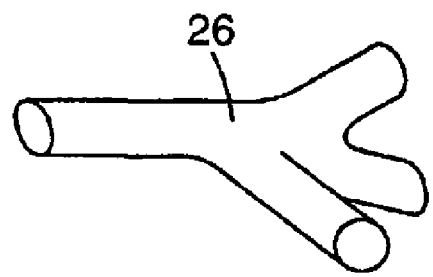
FIG. 2 is a schematic representation of the optical element of FIG. 2 in which uncured portions of the material have been removed, leaving only the optical element.

FIGS. 1 and 2 schematically illustrate one preferred methodology of the present invention in more detail. Referring to FIG. 1, system 10 includes laser light source 12 that directs laser light 14 through an optical element in the form of optical lens 16. Lens 16 focuses laser light 14 at focal region 18 within body 20 that includes one or more photodefinable constituent(s) in accordance with the present invention. Laser light 14 has an intensity, and the multiphoton photosensitizer has an absorption cross-section such that the light intensity outside of the focal region is insufficient to cause multiphoton absorption, whereas the light intensity in the portion of the photopolymerizable composition inside the focal region 18 is sufficient to cause multiphoton absorption causing photopolymerization within such focal region 18. In practical effect, this means that the volume of photopolymerizable composition within the focal region 18 will harden via photocuring, while portions of the composition outside of the focal region 18 are substantially unaffected.

A suitable translation mechanism 24 provides relative movement between body 20, lens 16, and/or and focal region 18 in three dimensions to allow focal region 18 to be positioned at any desired location within body 20. This relative movement can occur by physical movement of light source 12, lens 16, and/or body 20. Through appropriate exposure of successive regions of body 20 in an imagewise fashion, the corresponding photopolymerized portions of body 12 may form one or more three-dimensional structures within body 20. The resultant structures are then separated from the body 20 using a suitable technique, e.g., treatment with a solvent to remove the unexposed regions. One suitable system would include a mirror-mounted galvonometer with a moving stage.

Useful exposure systems include at least one light source (usually a pulsed laser) and at least one optical element. Preferred light sources include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts.

Another example is a Spectra Physics "Mai Tai" Ti:sapphire laser system, operating at 80 MHz, average power about 0.85 Watts, tunable from 750 to 850 nm, with a pulse width of about 100 femtoseconds. However, in practice, any light source that provides sufficient intensity (to effect multiphoton absorption) at a wavelength appropriate for the photosensitizer (used in the photoreactive composition) can be utilized. Such wavelengths can generally be in the range of about 300 to about 1500 nm; preferably, from about 600 to about 1100 nm; more preferably, from about 750 to about 850 nm.

Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) also can be utilized.

One skilled in the art can choose appropriate settings for using such laser systems to carry out multiphoton polymerization. For example, pulse energy per square unit of area (Ep) can vary within a wide range and factors such as pulse duration, intensity, and focus can be adjusted to achieve the desired curing result in accordance with conventional practices. If Ep is too high, the material being cured can be ablated or otherwise degraded. If Ep is too low, curing may not occur or may occur too slowly.

In terms of pulse duration when using near infrared pulsed lasers, preferred a preferred pulse length is generally less than about $10^{-8}$ second, more preferably less than about $10^{-9}$ second, and most preferably less than about $10^{-11}$ second. Laser pulses in the femtosecond regime are most preferred as these provide a relatively large window for setting Ep levels that are suitable for carrying out multiphoton curing. With picosecond pulses, the operational window is not as large. With nanosecond pulses, curing may proceed slower than might be desired in some instances or not at all. With such relatively long pulses, the Ep level may need to be established at a low level to avoid material damage when the pulses are so long, relatively.

Advantageously, the fabrication method of the present invention allows the use, if desired, of laser light 14 having a wavelength within or overlapping the range of wavelengths of light to be carried by optical element in the form of waveguide 26. This could be desirable because the photoinitiator used absorbs at half the wavelength of the laser line, and so does not attenuate the laser light. This results in greater latitude in selecting materials for fabricating the optical element or waveguide to minimize absorption of desired wavelengths of light to be carried by the optical element or waveguide. Thus, in some embodiments, laser light 14 may have a wavelength that is substantially the same as the wavelength of light to be carried by waveguide 26. In this context, "substantially the same" means within 10%, preferably within 5%, and more preferably within 1%.

Although lens 16 is shown, other optical elements useful in carrying out the method of the invention can be used to focus light 14 and include, for example, one or more of refractive optical elements (for example, lenses), reflective optical elements (for example, retroreflectors or focusing mirrors), diffractive optical elements (for example, gratings, phase masks, and holograms), diffusers, pockets cells, wave guides, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture characteristics to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20X Fluar).

Exposure times and scan rates generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity), as well as upon the nature of the composition exposed (and its concentrations of photosensitizer, photoinitiator, and electron donor compound). Generally, higher peak light intensity in the regions of focus allows shorter exposure times, everything else being equal. Linear imaging or "writing" speeds generally can be about 5 to 100,000 microns/second using a laser pulse duration of about 10E-8 to 10E-15 seconds (preferably, about 10E-12 to 10E-14 seconds) and about 10E3 to 10E9 pulses per second (preferably, about 10E5 to 10E8 pulses per second).

FIG. 1 shows how imagewise exposure of selected portions of body 20 formed photodefined, three-dimensional waveguide 26 within body 20. Portions 28 of body 20 that are outside the photodefined portions constituting waveguide 26 remain at least substantially uncured. Uncured portions of body 20 may be removed from waveguide 26 by a suitable technique, e.g., washing with a solvent or the like. This provides the recovered waveguide 26 as shown in FIG. 2. As an option, the resultant optical element 26 may be blanket irradiated with a photocuring fluence of energy. In some embodiments, blanket irradiation can enhance durability.

Advantageously, it can be appreciated that the present invention allows optical elements to be formed with any desired orientation in body 20. For example, if body 20 were to be supported upon a surface of a substrate (not shown), the optical axis, or axes as the case may be, may have any desired orientation relative to the substrate surface. Thus, relative to the surface, any such optical axis can be substantially vertical, substantially parallel, or at any other desired angle relative to the surface.

Generally, the photodefinable composition that constitutes body 20 of FIG. 1 generally includes at least one hydrophobic, photodefinable constituent having hydrophobic characteristics and a Tg of at least about 80° C. when cured and a multiphoton photoinitiator system including at least one multiphoton photosensitizer and optionally at least one photoinitiator. As an additional option, the multiphoton photoinitiator system may include an electron donor as described in Assignee's copending application titled MULTIPHOTON PHOTOSENSITIZATION SYSTEM, filed Jun. 14, 2001, in the name of Robert DeVoe incorporated herein by reference in its entirety. Optionally, other photodefinable constituents that are hydrophilic may also be additionally included in the composition, but the use of such hydrophilic materials is not preferred to avoid water uptake.

As used herein, "photodefinable" preferably refers to functionality directly or indirectly pendant from a monomer, oligomer, and/or polymer backbone (as the case may be) that participates in reactions upon exposure to a suitable source of electromagnetic energy. Such functionality generally includes not only groups that cure via a cationic mechanism upon radiation exposure but also groups that cure via a free radical mechanism. Representative examples of such photodefinable groups suitable in the practice of the present invention include epoxy groups, (meth)acrylate groups, olefinic carbon-carbon double bonds, allyloxy groups, alpha-methyl styrene groups, (meth)acrylamide groups, cyanate ester groups, vinyl ethers groups, combinations of these, and the like. Free radically curable groups are preferred. Of these, (meth)acryl moieties are most preferred. The term "(meth)acryl", as used herein, encompasses acryl and/or methacryl.

The various photodefinable constituents of body 20 may be monomeric, oligomeric, and/or polymeric. As used herein, the term "monomer" means a relatively low molecular weight material (i.e., having a molecular weight less than about 500 g/mole) having one or more photodefinable groups. "Oligomer" means a relatively intermediate molecular weight material (i.e., having a molecular weight of from about 500 up to about 10,000 g/mole). "Polymer" means a relatively large molecular weight material (i.e., about 10,000 g/mole or more). The term "molecular weight" as used throughout this specification means weight average molecular weight unless expressly noted otherwise.

Photodefinable materials suitable in the practice of the present invention preferably have a combination of characteristics that provide resultant optical elements with excellent dimensional and temperature stability. First, when photodefined and/or optionally postcured, e.g., to cause imidization of photodefinable polyimides, the materials are hydrophobic and have a glass transition temperature (Tg) of at least 80° C., preferably at least 100° C., more preferably at least 120° C., and most preferably at least 150° C. As a consequence, mechanical properties, including mechanical stability and shape, of the photodefined materials do not change substantially over these temperature ranges. Additionally, the cured materials have a substantially constant refractive index over a temperature range of 0° C. to 80° C., preferably −25° C. to 100° C., more preferably −40° C. to 120° C.

In this context, "substantially constant" means that the index of refraction of the photodefined material varies by less than 5% over the temperature range, preferably by less than 1%, more preferably by less than 0.1%, and most preferably less than 0.01%. The dimensional stability of photodefined materials comprising the optical elements of the present invention also may be defined by the CTE (coefficient of thermal expansion). The CTE of the photodefined materials is desirably less than 100, preferably less than 80, more preferably less than 60.

The materials also are desirably hydrophobic, which minimizes the tendency of the resultant optical elements to absorb water. Water absorption is undesirable in that water/moisture uptake can cause an optical element to change shape, hydrolyze, or otherwise degrade. Other optical and mechanical properties may also be affected. As used herein, "hydrophobic" means that the water absorption of a material preferably is no more than about 4% by weight as measured according to the immersion test specified in ASTM D570 following extended aging under 20° C./65% RH conditions, and preferably is no more than about 0.5% by weight.

The molecular weight of the photodefinable materials used in the present invention may have an impact upon the ease of manufacturability and/or the performance of the resultant optical element. For example, if the molecular weight is too low, on average, photodefining may cause excessive shrinkage, making it more difficult to control the dimensions of the resultant optical element. On the other hand, if the molecular weight is too high, on average, it may be more difficult to wash the uncured material away, if desired, after the optical element is formed. Balancing these concerns, the photodefinable materials preferably have a molecular weight on average in the range from 1,000 to 1,000,000, preferably 2,000 to 100,000, more preferably about 10,000 to 50,000.

A variety of photodefinable materials with the desired characteristics may be used. Representative examples include photodefinable polymers and/or oligomers that preferably are hydrophobic and soluble, polyimides, polyimideamides, polynorbornenes, reactive polynorbornene oligomers, fluorinated polymers, polycarbonates, cyclic polyolefins, combinations of these, and the like. "Soluble" means that a material dissolves in and is coatable from a solvent or a mixture of solvents. Suitable solvents include polar aprotic solvents such as N,N-dimethylacetamide, N-methylpyrrolidinone, N,N-dimethylformamide, as well as a wide variety of common solvents including but not limited to methyl ethyl ketone, cyclohexanone, dioxane, toluene, and propylene glycol methyl ether acetate, and mixtures thereof.

Photodefinable, soluble, hydrophobic polyimides presently are most preferred. Such polyimides can be homopolymers or copolymers prepared from aromatic tetracarboxylic acid anhydrides and one or more aromatic diamines, wherein each repeating unit of the polymer includes as least one benzylic methyl or benzylic ethyl group. Examples of such photodefinable, soluble polyimides useful in the invention include photosensitive polyimides that are known in the art. For example, Rubner et al., Photographic Science and Engineering, 1979, 23 (5), 303; U.S. Pat. No. 4,040,831, for example, reports commercialized photosensitive polyimide materials based on polyamic esters bearing pendant double bonds. Upon UV exposure, crosslinking occurs to produce a negative tone photoresist. After development with N-methyl pyrrolidone (NMP), the image is finally cured at high temperature (up to 350–400° C.; imidization starting at about 160° C. with removal of water and hydroxyethylmethacrylate (HEMA)). Complete imidization occurs at 400° C. This system is commercialized by Arch Chemicals under the tradename "Durmide".

Hiramoto et al, Macromol. Sci., Chem. 1984, A21, 1641 describe a polyamic acid salt photosensitive polyimide system by mixing a polyamic acid (PAA) with N,N-dimethylaminoethyl methacrylate. This system is commercialized under the tradename "Photoneece". See also U.S. Pat. No. 4,243,743.

U.S. Pat. Nos. 4,515,887 and 4,578,328 describe polyamic amide based photosensitive polyimides prepared by reacting polyamic acid with isocyanate-containing methacrylate such as isocyanato-ethyl methacrylate. The acid groups can be partially functionalized to provide aqueous base developability.

U.S. Pat. Nos. 5,292,619, 5,587,275, and 5,616,448 describe photosensitive polyimide siloxanes which offer good adhesion to metal and polyimides.

Photosensitive polyimides based on "chemical amplified" mechanism also are reported, for example, in U.S. Pat. No. 5,609,914 and U.S. Pat. No. 5,518,864). These photosensitive polyimides are positive-tone materials in which a photoacid generator (PAG) is needed in the formulation.

Autosensitive polyimides (or intrinsically photosensitive) are reported in U.S. Pat. Nos. 4,786,569 and 4,851,506 and use benzophenone-based crosslinking chemistry. A class of fluorine-containing autosensitive polyimides are described in U.S. Pat. Nos. 5,501,941, 5,504,830, 5,532,110, 5,599, 655 and EP 0456463A2.

When polyimides are used, it is generally preferred to post-bake or otherwise treat the resultant optical element under conditions effective to accomplish at least substantially complete imidization in accordance with conventional practices. Although the Tg of the cured material of the present invention is at least 80° C., the Tg may not be at least as high as 80° C. until after the imidization step, if any. Imidization increases the Tg and helps provide the element with good durability and stability over time.

Optionally, one or more photodefinable monomers may also be included in the composition, particularly those that have a Tg when cured as a homopolymer of at least about 80° C. In addition to being photodefinable, such monomers also can function as a solvent for the composition, which is beneficial in embodiments in which the composition is to be coated onto a substrate prior to photocuring. The monomers can enhance physical properties of waveguide 26, including hardness, abrasion resistance, Tg characteristics, modulus, and the like. The photodefinable monomers may be mono-, di-, tri-, tetra- or otherwise multifunctional in terms of photodefinable moieties. The amount of such monomers to be incorporated into the composition can vary within a wide range depending upon the intended use of the resultant composition. As general guidelines, the composition may contain from about 0 to about 80, preferably 30 to 60 weight percent of such monomers.

One illustrative class of radiation curable monomers that tend to have relatively high Tg characteristics when cured generally comprise at least one radiation curable (meth) acrylate moiety and at least one nonaromatic, alicyclic and/or nonaromatic heterocyclic moiety. Isobornyl (meth) acrylate is a specific example of one such monomer. A cured, homopolymer film formed from isobornyl acrylate, for instance, has a Tg of 88° C. The monomer itself has a molecular weight of 208 g/mole, exists as a clear liquid at room temperature, has a viscosity of 9 centipoise at 25° C., has a surface tension of 31.7 dynes/cm at 25° C., and is an excellent reactive diluent for many kinds of oligo/resins. In the practice of the present invention, Tg of a monomer refers to the glass transition temperature of a cured film of a homopolymer of the monomer, in which Tg is measured by differential scanning calorimetry (DSC) techniques. 1,6-Hexanediol di(meth)acrylate is another example of a monomer with high Tg characteristics.

As an option, a nonphotodefinable polymer may be incorporated into the photodefinable composition constituting body 20 to provide numerous benefits. Importantly, the relatively large size of such a material causes its diffusion rate to be relatively low, allowing the waveguide 26 to be multiphotonically formed within a stable background. In addition, the nonphotodefinable polymer contributes to the physical and refractive index characteristics of the resulting article. For instance, the nonphotodefinable polymer helps to reduce shrinkage upon curing and improves resilience, toughness, cohesion, adhesion, flexibility, tensile strength, and the like. Generally, to avoid light scattering, the nonphotodefinable polymer is desirably miscible with the photodefinable material.

The nonphotodefinable polymer may be thermoplastic or thermosetting. If thermosetting, the nonphotodefinable polymer preferably includes a different kind of curing functionality than does the photodefinable polymer(s), monomer(s)

if any, and oligomer(s) if any. Upon curing, such a material will form an IPN with the photodefined material. If a thermoplastic is used, such a material will tend to form a semi-IPN with the photodefined material. In one embodiment, the nonphotodefinable polymer may include pendant hydroxyl functionality. In the presence of an isocyanate crosslinking agent and a suitable catalyst such as dibutyl tin dilaurate, pendant hydroxyl moieties will undergo urethane crosslinking reactions with the NCO groups of the isocyanate crosslinking agent to form a crosslinked network comprising urethane linkages.

The glass transition temperature (Tg) of the nonphotodefinable polymer (or the cured polymer if it is thermosetting) can impact the optical performance of the resultant structure. If the Tg is too low, the resultant structure may not be as robust as might be desired. Accordingly, the nonphotodefinable polymer preferably has a Tg of at least 50° C., preferably at least 80° C., more preferably at least 120° C. In the practice of the present invention, Tg is measured using differential scanning calorimetry techniques.

Preferably, the nonphotodefinable polymer may be a thermosetting or thermoplastic polymer of a type that is as similar as possible to the photodefinable species in body 20. For example, if the photodefinable species is a polyimide, the nonphotodefinable polymer is preferably a polyimide as well. Matching the two materials in this manner helps to minimize the risk that the materials will undergo phase separation. Phase separation, if it were to occur, could impair the optical properties of optical element 26.

The amount of the nonphotodefinable polymer used may vary within a wide range. Generally, using 1 to 60 parts by weight of the nonphotodefinable polymer per 100 parts by weight of the photodefinable polymer would be suitable in the practice of the present invention.

The multiphoton photoinitiator system of the present invention preferably includes at least one multiphoton photosensitizer and optionally at least one photoinitiator that is capable of being photosensitized by the photosensitizer. An electron donor compound may also be included as an optional ingredient. While not wishing to be bound by theory, it is believed that light of sufficient intensity and appropriate wavelength to effect multiphoton absorption can cause the multiphoton photosensitizer to be in an electronic excited state via absorption of two photons, whereas such light is generally not capable of directly causing the photodefinable materials to be in an electronic excited state. The photosensitizer is believed to then transfer an electron to the photoinitiator, causing the photoinitiator to be reduced. The reduced photoinitiator can then cause the photodefinable materials to undergo the desired curing reactions. As used herein, "cure" means to effect polymerization and/or to effect crosslinking. Thus, by appropriate focusing of such light, photodefining can be controllably induced in the volume of focus with relatively high resolution to form optical elements with simple or complex, three dimensional geometry, as desired.

Multiphoton photosensitizers are known in the art and illustrative examples having relatively large multiphoton absorption cross-sections have generally been described e.g., by Marder, Perry et al., in PCT Patent Applications WO 98/21521 and WO 99/53242, and by Goodman et al., in PCT Patent Application WO 99/54784. Although multiphoton cross-sections greater than fluorescein are not necessary for carrying out the present invention, in preferred aspects of the present invention, multiphoton photosensitizers suitable for use in the multiphoton photoinitiator system of the photo-reactive compositions are those that are capable of simultaneously adsorbing at least two photons when exposed to sufficient light and that have a two-photon adsorption cross-section greater than that of fluorescein (that is, greater than that of 3', 6'-dihydroxyspiro[isobenzofuran-1(3H), 9'-[9H]xanthen]3-one). Generally, the cross-section can be greater than about $50 \times 10^{-50}$ cm$^4$ sec/photon, as measured by the method described by C. Xu and W. W. Webb in J. Opt. Soc. Am. B, 13, 481 (1996) (which is referenced by Marder and Perry et al. in International Publication No. WO 98/21521 at page 85, lines 18–22).

This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Assuming that the emitting state is the same under one- and two-photon excitation (a common assumption), the two-photon absorption cross-section of the photosensitizer, ($\delta_{sam}$), is equal to $\delta_{ref}(I_{sam}/I_{ref})(\phi_{sam}/\phi_{ref})$, wherein $\delta_{ref}$ is the two-photon absorption cross-section of the reference compound, $I_{sam}$ is the fluorescence intensity of the photosensitizer, $I_{ref}$ is the fluorescence intensity of the reference compound, $\phi_{sam}$ is the fluoroescence quantum efficiency of the photosensitizer, and $\phi_{ref}$ is the fluorescence quantum efficiency of the reference compound. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregation effects).

Although not necessary for carrying out the present invention, it is preferred that the two-photon absorption cross-section of the photosensitizer is greater than about 1.5 times that of fluorescein (or, alternatively, greater than about $75 \times 10^{-50}$ cm$^4$ sec/photon, as measured by the above method); more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the photosensitizer is soluble in the photodefinable materials used to form body 20 of the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000–55,000 molecular weight, 9.0–13.0% hydroxyl content polyvinyl butyral (Butvar™ B76, Monsanto); 0.3 parts trimethylolpropane trimethacrylate; and 0.03 parts 2-methyl-4,6-bis (trichloromethyl)-s-triazine (see Bull. Chem. Soc. Japan, 42, 2924–2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis (trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a multiphoton photosensitizer can also be selected based in part upon shelf stability considerations. Accordingly, selection of a particular photosensitizer can depend to some extent upon the particular reactive species utilized (as well as upon the choices of electron donor compound and/or photoinitiator, if either of these are used).

Particularly preferred multiphoton photosensitizers include those exhibiting large multiphoton absorption cross-sections, such as Rhodamine B (that is, N-[9-(2-carboxyphenyl)-6-(diethylamino)-3H-xanthen-3-ylidene]-N-ethylethanaminium chloride) and the four classes of photosensitizers described, for example, by Marder and Perry et al. in International Patent Publication Nos. WO 98/21521 and WO 99/53242. The four classes can be described as follows: (a) molecules in which two donors are connected to a conjugated π (pi)-electron bridge; (b) molecules in which two donors are connected to a conjugated π (pi)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge). The four above-described classes of photosensitizers can be prepared by reacting aldehydes with ylides under standard Wittig conditions or by using the McMurray reaction, as detailed in International Patent Publication No. WO 98/21521.

Other multiphoton photosensitizer compounds are described by Reinhardt et al. (for example, in U.S. Pat. Nos. 6,100,405, 5,859,251, and 5,770,737) as having large multiphoton absorption cross-sections, although these cross-sections were determined by a method other than that described herein. Other suitable multiphoton initiators also have also been described in Goodman, et al in PCT Patent Publication WO 99/54784, Mukesh P. Joshi et al., "Three-dimensional optical circuitry using two-photo-assisted polymerization," Applied Physics Letters, Volume 74, Number 2, Jan. 11, 1999, pp. 170–172; Cornelius Diamond et al., "Two-photon holography in 3-D photopolymer host-guest matrix," OPTICS EXPRESS, Vol. 6, No. 3, Jan. 31, 2000, pp. 64–68; Brian H. Cumpston et al., "Two-photon polymerization initiators for three-dimensional optical data storage and microfabrication," NATURE, Vol. 398, Mar. 4, 1999, pp. 51–54; T. J. Bunning et al., "Electrically Switchable Gratings Formed Using Ultrafast Holographic Two-Photon-Induced Photopolymerization," Chem. Mater. 2000, 12, 2842–2844; Cornelius Diamond et al., "Two-photon holography in 3-D photopolymer host-guest matrix: errata," OPTICS EXPRESS, Vol. 6, No. 4, Feb. 14, 2000, pp. 109–110; S. M. Kirkpatrick et al., "Holographic recording using two-photon-induced photopolymerization," Appl. Phys. A 69, 461–464 (1999); Hong-Bo Sun et al., "Three-dimensional photonic crystal structures achieved with two-photon-absorption photopolymerization of material," APPLIED PHYSICS LETTERS, Volume 74, Number 6, Feb. 8, 1999, pp. 786–788; Kevin D. Belfield et al., "Near-IR Two-Photon Photoinitiated Polymerization Using a Fluorone/Amine Initiating System," J. Am. Chem. Soc. 2000, 122, 1217–1218.

The preferred multiphoton initiator system generally includes an amount of the multiphoton photosensitizer that is effective to facilitate photopolymerization within the focal region of the energy being used for imagewise curing. Using from about 0.01 to about 10, preferably 0.1 to 5, parts by weight of the multiphoton initiator per 5 to 100 parts by weight of the photodefinable material(s) would be suitable in the practice of the present invention.

In addition to the multiphoton photosensitizer, the preferred multiphoton initiator system of the present invention may include other components that help to enhance the performance of photodefining. For instance, certain one-photon photoinitiators can be photosensitized by the multiphoton photosensitizer and, consequently, function as electron mediators in multiphoton photodefining reactions. One-photon photoinitiators useful in the present invention include onium salts, such as sulfonium, diazonium, azinium, and iodonium salts such as a diaryliodonium salt, chloromethylated triazines, such as 2-methyl-4,6-bis (trichloromethyl)-s-triazine, and triphenylimidazolyl dimers. Useful iodonium salts are those that are capable of initiating polymerization following one-electron reduction or those that decompose to form a polymerization-initiating species. Suitable iodonium salts are described by Palazzotto et al., in U.S. Pat. No. 5,545,676, in column 2, lines 28 through 46. Useful chloromethylated triazines include those described in U.S. Pat. No. 3,779,778, column 8, lines 45–50. Useful triphenylimidazolyl dimers include those described in U.S. Pat. No. 4,963,471, column 8, lines 18–28, the teachings of which are incorporated herein by reference. These dimers include, for example, 2-(o-chlorophenyl)-4,5-bis(m-methoxyphenyl)imidazole dimer.

As described in Assignee's co-pending application titled MULTIPHOTON PHOTOSENSITIZATION SYSTEM, filed Jun. 14, 2001, in the name of Robert DeVoe and bearing Attorney Docket No. 55639PCT4A.003, such other components also may include both an electron donor compound and a photoinitiator. Advantageously, use of this combination enhances the speed and resolution of multiphoton curing. The photoinitiator serves double duty, as well, by also optionally facilitating blanket photodefining of the photodefinable composition with suitable curing energy. When such an electron donor and/or single photon initiator are used, the composition may include up to about 10, preferably 0.1 to 10, parts by weight of one or more electron donors and 0.1 to 10, preferably 0.1 to 5, parts by weight of one or more single photon initiators per 5 to 100 parts by weight of the multiphoton initiator.

A wide variety of optional adjuvants may also be included in the photodefinable compositions of the present invention, depending upon the desired end use. Suitable adjuvants include solvents, diluents, plasticizers, pigments, dyes, inorganic or organic reinforcing or extending fillers, thixotropic agents, indicators, inhibitors, stabilizers, ultraviolet absorbers, medicaments (for example, leachable fluorides), and the like. The amounts and types of such adjuvants and their manner of addition to the compositions will be familiar to those skilled in the art, and should be chosen so as to not adversely effect the optical properties of the subject optical elements.

Solvent advantageously may be included to provide the composition with a suitable coatable viscosity in those embodiments in which the composition is to be coated onto a substrate. The amount of solvent, thus, depends upon the desired coating technique. Examples of representative coating techniques include spin coating, knife coating, brushing, spraying, pouring, gravure coating, curtain coating, misting, and the like. The kind of solvent to be used is not critical and will depend upon the materials that are to be dissolved or otherwise dispersed. As noted above, photodefinable monomers may themselves function as a solvent. Otherwise, conventional solvents such as water, alcohol, ketones, esters, ethers, chlorinated hydrocarbons such as dichloromethane, acetonitrile, N-methyl-pyrrolidone (NMP), dioxane, propylene glycol methyl ether acetate, and the like may be used.

The photodefinable compositions of the present invention can be prepared by any suitable method in accordance with conventional practices. In one approach, the components are combined under "safe light" conditions using any order and manner of combination (optionally, with stirring or agitation), although it is sometimes preferable (from a shelf life and thermal stability standpoint) to add the photoinitiator(s) last (and after any heating step that is optionally used to facilitate dissolution of other components).

Other objects, features, and advantages of this invention are further illustrated by the following examples, but the particular materials and amounts thereof recited in these examples, as well as other conditions and details, should not be construed to unduly limit this invention.

EXAMPLE 1

Example 1

A solution of photodefinable polyimide G

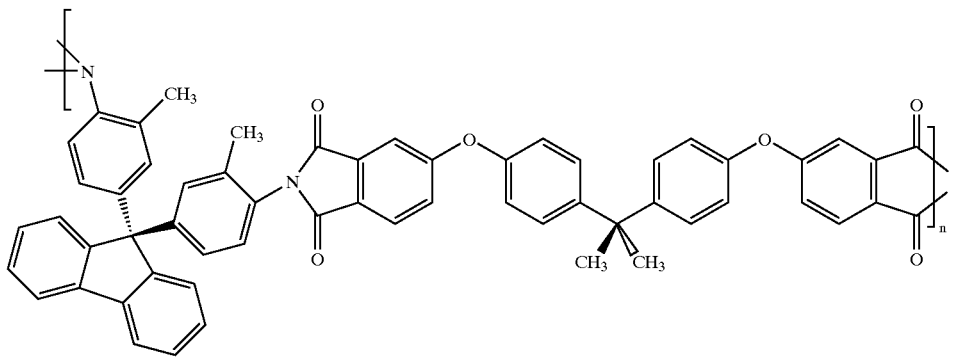

BPADA-OTBAF and two-photon photosensitization system including 4,4'-bis (diphenylamino)-trans-stilbene (1 weight %, based on solids) and diphenyliodonium hexafluorophosphate (1 weight % based on solids) is prepared in a suitable solvent (NMP) at approximately 20% solids and coated on a silicon wafer by knife coating to about 200–300 microns wet thickness. The coating is dried overnight (about 16 hrs) in an oven at about 50° C. Exposure and patterning is performed using a two-photon microscope with a Ti:Sapphire laser operating at the two-photon absorption maximum of 4,4'-bis(diphenylamino)-trans-stilbene, 700 nm, and the light is focused through a 40× objective with a focal length of 4.48 mm and a numerical aperture of 0.65. The pattern constituting the optical element is produced by manipulation of the substrate under the fixed focal point of the beam, accomplished by means of X-Y-Z servo-feedback-controlled translation stages equipped with high-resolution encoders. A pattern of interconnected waveguides with primary axes parallel to the plane of the film is written into the medium, of varying width and height, resulting in a latent, three dimensional image of the exposed pattern. The image is developed by removing the uncured polyimide by washing the coating with N-methylpyrrolidone (NMP), a suitable solvent for the uncured polyimide. The resulting image of insoluble polyimide waveguides is capable of effectively carrying light injected in the waveguide. Optionally, the film can be further cured by heating to 300° C. in a nitrogen atmosphere for 30 minutes, maintaining the waveguide structure and performance.

Waveguides prepared in this manner exhibit good light-conducting properties. In addition, when exposed to conditions of 85° C. and 85% relative humidity for 24 hours, the waveguides exhibit less than 0.3 db increase in attenuation.

Similarly, polyimides with intrinsically photosensitive groups in the main chain (based on benzophenonetetracarboxylic acid dianhydride) or side chain photocrosslinkable polyimides, such as those prepared from polyamine H, can be substituted for polyimide G:

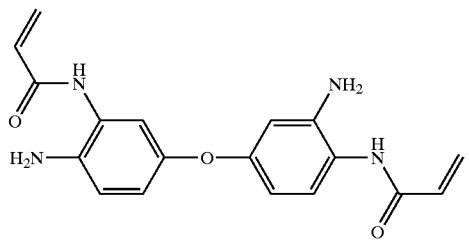

H

Example 2

In this example, the following abbreviations are used:

MPS I—multiphoton photo sensitizer I prepared as described below.

DPI PF$_6$—diphenyliodonium hexafluorophosphate, which can be made essentially as described in column 4 of U.S. Pat. No. 4,394,403 (Smith), using silver hexafluorophosphate.

Durimide 7520—a photoimageable polyimide, 40 weight % solids in NMP, available from Arch Chemicals, E. Providence, R.I.

NMP—1-methyl-2-pyrrolidinone, available from Aldrich, Milwaukee, Wis.

TMSPMA—3-(trimethylsilylpropyl) methacrylate, available from Aldrich, Milwaukee, Wis.

PGMEA—propylene glycol methyl ether acetate, available from Aldrich, Milwaukee, Wis.

(a) Reaction of 1,4-bis(bromomethyl)-2,5-dimethoxybenzene with triethyl phosphite:

1,4-Bis(bromomethyl)-2,5-dimethoxybenzene was prepared according to the literature procedure (Syper et al, Tetrahedron, 39, 781–792, 1983). The 1,4-bis(bromomethyl)-2,5-dimethoxybenzene (253 g, 0.78 mol) was placed into a 1000 mL round bottom flask. Triethyl phosphite (300 g, 2.10 mol) was added, and the reaction was heated to vigorous reflux with stirring for 48 hours under nitrogen atmosphere. The reaction mixture was cooled and the excess triethyl phosphite was removed under vacuum using a Kugelrohr apparatus. Upon heating to 100° C. at 0.1 mm Hg, a clear oil resulted. Upon cooling, the desired product solidified and was suitable for use directly in the next step. The $^1$H NMR spectrum of the product was consistent with the desired product. Recrystallization from toluene yielded colorless needles.

(b) Synthesis of 1,4-bis-[4-(diphenylamino)styryl]-2,5-(dimethoxy)benzene-(Multiphoton Photosensitizer I (MPS I)):

A 1000 mL round bottom flask was fitted with a calibrated dropping funnel and a magnetic stirrer. The flask was charged with the product prepared from the above reaction (19.8 g, 45.2 mmol) and N,N-diphenylamino-p-benzaldehyde (25 g, 91.5 mmol, available from Fluka Chemical Corp., Milwaukee, Wis.). The flask was flushed with nitrogen and sealed with septa. Anhydrous tetrahydrofuran (750 mL) was cannulated into the flask and all solids dissolved. The dropping funnel was charged with potassium tertiary butoxide (125 mL, 1.0 M in THF). The solution in the flask was stirred, and the potassium tertiary butoxide solution was added to the contents of the flask over the course of 30 minutes. The solution was then left to stir at ambient temperature overnight. The reaction was then quenched by the addition of water (500 mL). Stirring was continued, and after about 30 minutes a highly fluorescent yellow solid had formed in the flask. The solid was isolated by filtration, air-dried, and then recrystallized from toluene (450 mL). The desired product (MPS I) was obtained as fluorescent needles (24.7 g, 81% yield). The $^1$H NMR spectrum of the product was consistent with the proposed structure.

(c) Preparation of Optical Element:

MPS I (60 mg) and DPI PF$_6$ (120 mg) were dissolved in 4.5 g N-methylpyrrolidone in a 10 mL vial. The resulting solution was added to Durimide 7520 (19 g). After stirring at room temperature for 15 minutes, the resulting Durimide 7520 solution was spin-coated onto a TMSPMA treated silicon wafer at 750 rpm for 30 seconds. The resulting polyimide coated wafer was baked at 85° C. for 15 minutes. After cooling to room temperature, the wafer was spin-coated again with the solution at 750 rpm for 30 seconds. After baking at 85° C. for 15 minutes, a film with a thickness of about 85 µm on was obtained.

In a dose-array scan experiment the above coated film was placed horizontally on a movable stage and patterned by focusing the output of a Ti:Sapphire laser (part of a "Hurricane" system manufactured by Spectra-Physics Laser) (800 nm, 100 fs pulses, 80 MHz), equipped with a 10× objective lens, into the film. A pattern of lines was produced in the film at two power levels where for each line the speed of the stage was increased by a factor of the square root of 2, starting at 77 µm/sec. The images were developed with cyclohexanone/N-methylpyrrolidone (4/1) and rinsed with PGMEA. The polyimide images were finally imidized under nitrogen with heating at a rate of 3° C./min to 300° C. and a total heating time of 5 hours. The number of polyimide lines produced at each power level, as well as writing speed were as follows:

| Power | 70 mW | 18 mW |
|---|---|---|
| Number of lines observed | At least 18 | 10 |
| Writing speed | >39,400 µm/sec | 2,500 µm/sec |

The cured polyimide had a coefficient of thermal expansion (CTE) of 55 ppm. The polyimide lines could be used as waveguides.

Example 3

Preparation of Cylindrical Lenses:

An 85 micron film prepared as in Example 2 was mounted on a computer-controlled 3-axis stage, and the output of a Ti:Sapphire laser (part of a "Hurricane" system manufactured by Spectra-Physics Laser) (800 nm, 100 fs pulse, 29 mW, 80 MHz), equipped with a 40× objective lens (numeric aperature of 0.65), was focused into the film. The stage was programmed to move so as to produce a series of cylindrical lens images, each 100 micrometers wide by 200 micrometers long by 80 micrometers tall, with a radius of curvature of 100 micrometers. The sample was scanned under the focused beam at a rate of 1 mm/s to produce the structures. After development with cyclohexanone/1-methyl-2-pyrrolidinone (4/1), a series of three-dimensional cylindrical lenses were obtained on a silicon wafer with the lens curvature normal to the silicon wafer substrate.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of fabricating a three dimensional optical element, comprising the steps of:
   (a) providing a photocurable composition, comprising
      (i) a hydrophobic, photodefinable polymer or oligomer, said photodefinable polymer or oligomer having a glass transition temperature in the cured state of at least about 80° C.;
      (ii) a multiphoton photoinitiator system; and
   (b) imagewise exposing one or more portions of the composition to said electromagnetic energy under conditions effective to photodefinably form at least a portion of a three-dimensional optical element comprising a photoinitiator and a separate photosensitizer.

2. The method of claim 1, wherein the hydrophobic, photodefinable polymer or oligomer has a glass transition temperature greater than about 100° C.

3. The method of claim 1, wherein the hydrophobic, photodefinable polymer comprises a polyimide or polyimide precursor.

4. The method of claim 1, wherein the multiphoton photoinitiator system further comprises an electron donor compound.

5. The method of claim 1, wherein the photocurable composition further comprises a nonphotodefinable binder.

6. The method of claim 5, wherein the nonphotodefinable binder comprises a thermoplastic polymer having a glass transition temperature of at least about 80° C.

7. The method of claim 5, wherein the hydrophobic, photodefinable polymer comprises a polyimide and wherein the nonphotodefinable binder comprises a polyimide.

8. The method of claim 5, wherein the nonphotodefinable binder comprises a thermosetting polymer having a glass transition temperature of at least about 80° C. when cured.

9. The method of claim 1, further comprising the step of removing at least an uncured portion of the uncured photocurable composition to recover the resultant optical element.

10. The method of claim 9, further comprising blanket irradiating the recovered optical element.

11. The method of claim 1, wherein the optical element comprises a polyimide and the method further comprises subjecting at least the resultant optical element to an imidization treatment.

12. The method of claim 1, wherein the photocurable composition further comprises a monomer, said monomer forming a homopolymer that has a glass transition temperature of at least about 80° C.

13. The method of claim 12, wherein the monomer comprises isobornyl (meth)acrylate.

14. The method of claim 12, wherein the monomer comprises 1,6-hexanediol di(meth)acrylate.

15. The method of claim 1, wherein the optical element is formed over a substrate surface, said optical element having an optical axis that is non-vertically oriented with respect to the substrate surface.

16. The method of claim 15, wherein the optical axis is substantially parallel to the substrate surface.

17. A method of fabricating a three dimensional optical element comprising the steps of:
   (a) providing a photo-hardenable composition, comprising
      (i) a hydrophobic, photodefinable polymer, said photodefinable polymer having a glass transition temperature in the cured state of at least about 80° C., and having a substantially constant index of refraction in the cured state in a temperature range from 0° C. to 80° C.;
      (ii) a multiphoton photoinitiator system; and
   (b) coating the photo-hardenable fluid composition onto a substrate;
   (c) imagewise exposing one or more portions of the coated composition to said electromagnetic energy under conditions effective to photodefinably form at least a portion of a three-dimensional optical element comprising a photoinitiator and a separate photosensitizer.

18. A photodefinable composition that can be imagewise cured using a multiphoton curing technique, said composition comprising:
   (a) a hydrophobic, photodefinable polymer, said photodefinable polymer having a glass transition temperature in the cured state of at least about 80° C., and having a substantially constant index of refraction in the cured state in a temperature range from 0° C. to 80° C.; and
   (b) a multiphoton photoinitiator system comprising a photoinitiator and a separate photosensitizer.

19. An optical element derived from ingredients comprising an imagewise, photodefined composition, said composition comprising:
   (a) a hydrophobic, photodefinable polymer, said photodefinable polymer having a glass transition temperature in the cured state of at least about 80° C., and having a substantially constant index of refraction in the cured state in a temperature range from 0° C. to 80° C.; and
   (b) a multiphoton photoinitiator system comprising a photoinitiator and a separate photosensitizer.

* * * * *

UNITED STATES PATENT AND TRADEMARK OFFICE
CERTIFICATE OF CORRECTION

PATENT NO.      : 6,855,478 B2
APPLICATION NO. : 10/297957
DATED           : February 15, 2005
INVENTOR(S)     : Devoe, Robert J.

It is certified that error appears in the above-identified patent and that said Letters Patent is hereby corrected as shown below:

Title Page (Abstract) - Line 7 - Delete "phtoinitiator" and inset - - photoinitiator - -, therefor.

Page 2 Col. 1 (Other Publications) - Line 5 - Delete "Soc," and insert - - Soc. - -, therefor.

Page 2 Col. 2 (Other Publications) - Line 2 - Delete "Cox." and insert - - Cox, - -, therefor.

Page 2 Col. 2 (Other Publications) - Line 3 - Delete "Advanced" and insert - - Advances - -, therefor.

Page 2 Col. 2 (Other Publications) - Line 5 - Delete "Soc," and insert - - Soc. - -, therefor.

Page 2 Col. 2 (Other Publications) - Line 30 - Delete "et. el." and insert - - et al., - -, therefor.

Page 2 Col. 2 (Other Publications) - Line 46 -Delete "Kueberl" and insert - - Kuebler - -, therefor.

Page 2 Col. 2 (Other Publications) - Line 48 - Delete "XP0080000209" and insert - - XP008000209 - -, therefor.

Page 2 Col. 2 (Other Publications) - Line 53 - Delete "XP0080000191" and insert - - XP008000191 - -, therefor.

Page 3 Col. 1 (Other Publications) - Line 1 - Delete "Wensellers" and insert - - Wenseleers - -, therefor.

Page 3 Col. 1 (Other Publications) - Line 1 - Delete "Orders-of Magnitude" and insert - - Orders-of-Magnitude - -, therefor.

Page 3 Col. 1 (Other Publications) - Line 6 - Delete "vol,." and insert - - Vol. - -, therefor.

Page 3 Col. 2 (Other Publications) - Line 1-2 - Delete "Resulution" and insert - - Resolution - -, therefor.

UNITED STATES PATENT AND TRADEMARK OFFICE
CERTIFICATE OF CORRECTION

PATENT NO. : 6,855,478 B2
APPLICATION NO. : 10/297957
DATED : February 15, 2005
INVENTOR(S) : Devoe, Robert J.

It is certified that error appears in the above-identified patent and that said Letters Patent is hereby corrected as shown below:

Page 3 Col. 2 (Other Publications) - Line 5 - Delete "SnI" and insert - - Sn1 - -, therefor.

Page 3 Col. 2 (Other Publications) - Line 27 - Delete "Optic" and insert - - Optics - -, therefor.

Page 3 Col. 2 (Other Publications) - Line 30 - Delete "9-Fluorenal" and insert - - 9-Fluorenol - -, therefor.

Page 3 Col. 2 (Other Publications) - Line 62 - Delete "pp. 479-1993." and insert - - p. 479, 1993. --, therefor.

Page 4 Col. 1 (Other Publications) - Line 1 - Delete "et al," and insert - - et al., - -, therefor.

Page 4 Col. 2 (Other Publications) - Line 5 - Delete "Clorants" and insert - - Colorants - -, therefor.

Column 6 - Line 65 - Delete "pockets" and insert - - pockels - -, therefor.

Column 7 - Line 59 - After "De Voe" and insert - - and bearing attorney docket number 55639PCT4A.003 - -.

Column 18 - Line 27 - Delete "10x" and insert - - 10X - -, therefor.

Column 18 - Line 55 - Delete "40x" and insert - - 40x - -, therefor.

Signed and Sealed this

Fifteenth Day of August, 2006

JON W. DUDAS
*Director of the United States Patent and Trademark Office*